(12) United States Patent
Liu et al.

(10) Patent No.: US 8,648,370 B2
(45) Date of Patent: Feb. 11, 2014

(54) WAFER-TYPE LIGHT EMITTING DEVICE HAVING PRECISELY COATED WAVELENGTH-CONVERTING LAYER

(75) Inventors: Wen-Huang Liu, Hsinchu (TW);
Yuan-Hsiao Chang, Hsinchu (TW);
Hung-Jen Kao, Hsinchu (TW);
Chung-Che Dan, Hsinchu (TW);
Feng-Hsu Fan, Hsinchu (TW); Chen-Fu Chu, Hsinchu (TW)

(73) Assignee: Semileds Optoelectronics Co., Ltd., Miao-Li County (TW)

( * ) Notice: Subject to any disclaimer, the term of this patent is extended or adjusted under 35 U.S.C. 154(b) by 97 days.

(21) Appl. No.: 13/118,334

(22) Filed: May 27, 2011

(65) Prior Publication Data

US 2011/0316017 A1 Dec. 29, 2011

(30) Foreign Application Priority Data

Jun. 29, 2010 (TW) .................................. 99121311 A

(51) Int. Cl.
*H01L 33/00* (2010.01)

(52) U.S. Cl.
USPC 257/98; 257/100; 257/E33.061; 257/E33.059

(58) Field of Classification Search
USPC ................... 257/79–103; 438/22–47
See application file for complete search history.

(56) References Cited

U.S. PATENT DOCUMENTS

| | | | | |
|---|---|---|---|---|
| 2005/0077529 A1* | 4/2005 | Shen | | 257/79 |
| 2006/0157686 A1* | 7/2006 | Jang et al. | | 257/14 |
| 2006/0281203 A1* | 12/2006 | Epler et al. | | 438/22 |
| 2007/0170454 A1* | 7/2007 | Andrews | | 257/100 |
| 2008/0164457 A1* | 7/2008 | Furukawa et al. | | 257/13 |
| 2008/0173884 A1* | 7/2008 | Chitnis et al. | | 257/98 |
| 2008/0179611 A1* | 7/2008 | Chitnis et al. | | 257/98 |
| 2009/0014736 A1* | 1/2009 | Ibbetson et al. | | 257/98 |
| 2009/0065790 A1* | 3/2009 | Chitnis et al. | | 257/88 |
| 2009/0250821 A1* | 10/2009 | Borthakur | | 257/762 |
| 2010/0109025 A1* | 5/2010 | Bhat | | 257/88 |
| 2010/0200887 A1* | 8/2010 | Urano et al. | | 257/98 |
| 2010/0207134 A1* | 8/2010 | Tanaka et al. | | 257/89 |
| 2010/0265737 A1* | 10/2010 | Kim | | 362/602 |
| 2011/0085352 A1* | 4/2011 | Ito et al. | | 362/617 |
| 2012/0211778 A1* | 8/2012 | Wan et al. | | 257/89 |

FOREIGN PATENT DOCUMENTS

| | | | | | |
|---|---|---|---|---|---|
| WO | 2009014219 | * | 1/2009 | | H01L 33/00 |
| WO | WO 2009014219 | * | 1/2009 | | H01L 33/00 |
| WO | 2009028611 | * | 3/2009 | | H01L 33/00 |
| WO | WO 2009028611 | * | 3/2009 | | H01L 33/00 |
| WO | 2009145298 | * | 12/2009 | | H01L 33/00 |
| WO | WO 2009145298 | * | 12/2009 | | H01L 33/00 |

* cited by examiner

*Primary Examiner* — Fernando L Toledo
*Assistant Examiner* — Victoria K Hall
(74) *Attorney, Agent, or Firm* — WPAT, PC; Justin King

(57) ABSTRACT

The invention relates to a wafer-type light emitting device having a substrate, one or more light emitting semiconductors formed on the substrate, one or more frames provided over the one or more light emitting semiconductors, and one or more wavelength-converting layers applied on the one or more light emitting semiconductors and confined by the one or more frames, wherein the wafer-type light emitting device is diced into a plurality of separate light emitting units.

26 Claims, 8 Drawing Sheets

US 8,648,370 B2

WAFER-TYPE LIGHT EMITTING DEVICE HAVING PRECISELY COATED WAVELENGTH-CONVERTING LAYER

CLAIM OF PRIORITY

This application claims the priority benefit of Taiwan Application Serial Number 099121311, filed on Jun. 29, 2010. All disclosure of the Taiwan application is incorporated herein by reference.

BACKGROUND OF THE INVENTION

1. Field of the Invention

The invention relates to a light emitting device, especially to a wafer-type light emitting device having a precisely coated wavelength-converting layer.

2. Description of Related Art

In a conventional light emitted diode (LED) configuration, it is typical that a fluorescent layer is coated on the LED to convert the wavelengths of emitted lights. As a result, the fluorescent layer is also called a wavelength-converting layer. However, since the amount of the fluorescent layer that is coated is difficult to control precisely, the thickness of the fluorescent layer often becomes too thin or too thick, and hence the production of LEDs will have a lower yield and a higher cost. Consequently, a light emitting device having a precisely coated wavelength-converting layer is needed so as to improve the yield and to lower the production cost.

BRIEF SUMMARY OF THE INVENTION

The invention relates to a wafer-type light emitting device having a substrate, one or more light emitting semiconductors formed on the substrate, one or more frames provided over the one or more light emitting semiconductors, and one or more wavelength-converting layers applied on the one or more light emitting semiconductors and confined by the one or more frames, wherein the wafer-type light emitting device is diced into a plurality of separate, individual light emitting units.

Additional advantages and other aspects of the invention will be readily apparent from the following detailed description setting forth the principles of the invention with reference to the accompanied drawings.

DETAILED DESCRIPTION OF THE INVENTION

Figure 8:
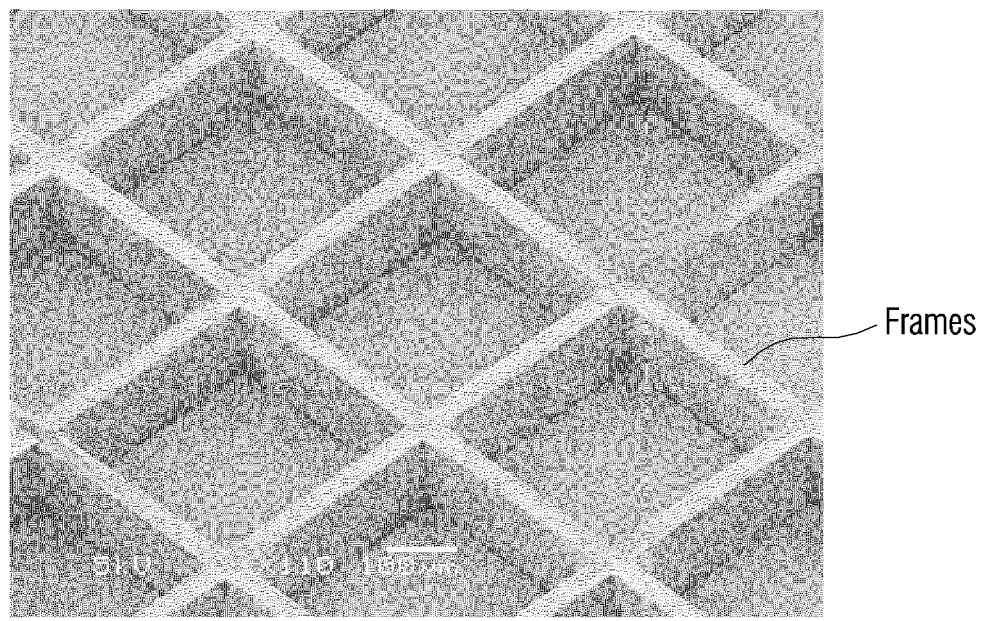
FIG. 8 shows an electron microscopy image of a light emitting device having frames during wafer-level manufacturing according to an embodiment of the invention.

The invention is directed to a bulk light emitting device manufactured in the form of a wafer and diced into a plurality of separate, individual light emitting units. Various embodiments of the invention set forth herein include these features. FIG. 8 shows an electron microscopy image of a light emitting device having frames during wafer-level manufacturing according to an embodiment of the invention. A plurality of separate, individual light emitting units having frames can be obtained using a dicing procedure after the wafer-level light emitting device is manufactured. The frames as disclosed herein can be configured as a dam when filling in a fluorescent mixture such that the fluorescent mixture is confined by the frames after it is filled in so as to prevent the fluorescent mixture from overflowing to other areas in which filling with fluorescent mixture is not desired. A white light can be obtained by converting the emitted lights by the fluorescent mixture within the frames. Additional advantages are facilitating more uniformly distributed correlated color temperatures (CCTs), improving yield with respect to CCT, and reducing dosage of fluorescent particles.

Figure 1:
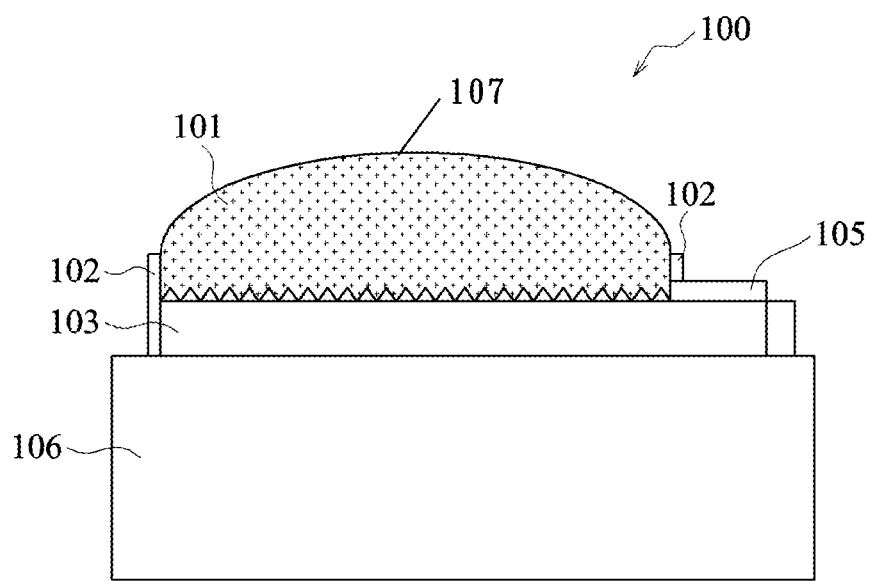
FIG. 1 shows a simplified cross-sectional view of a separate, individual light emitting unit diced from a wafer-type light emitting device according to an embodiment of the invention.

Various embodiments of the invention will be explained in detail below. For convenience, the structure of the bulk wafer-type light emitting device will be explained on the basis of separate, individual light emitting units. For example, FIG. 1 shows a simplified cross-sectional view of a separate, individual light emitting unit 100 diced from a wafer-type light emitting device according to an embodiment of the invention. As shown in FIG. 1, the light emitting unit 100 includes a substrate 106, a light emitting semiconductor 103 formed on the substrate 106, a frame 102 provided over the light emitting semiconductor 103, and a wavelength-converting layer 101 applied on the light emitting semiconductor 103 and confined by the frame 102. In other words, the wafer-type light emitting device according to this embodiment includes a substrate 106, a light emitting semiconductor 103 formed on the substrate 106, a frame 102 provided over the light emitting semiconductor 103, and a wavelength-converting layer 101 applied on the light emitting semiconductor 103 and confined by the frame 102. Thereafter, the wafer-type light emitting device is diced into a plurality of separate, individual light emitting units 100. The relationship between the wafer-type light emitting device and the light emitting units will not be described again for the following embodiments.

A bonding pad 105 is provided on the light emitting semiconductor 103 of the light emitting unit 100. In addition, a surface of the light emitting semiconductor 103 that is adjacent to the wavelength-converting layer 101 can be roughened to enhance light emitting efficiency. Moreover, the wavelength-converting layer 101 can undergo a heat treatment at a heat treating temperature ranging between about 60° C. and about 300° C. The wavelength-converting layer 101 can be applied using at least one of precise dispensing, precise stamping, precise jetting, and screen printing. The wavelength-converting layer 101 can include fluorescent particles mixed with one or more organic chemicals (such as silicone and/or epoxy). Further, a diluting agent such as toluene, heptane, normal hexane, isopropyl alcohol, etc. can be added when mixing the fluorescent particles with the organic chemicals. Alternatively, the wavelength-converting layer 101 can include fluorescent particles mixed with a glass. Moreover, for example, a weight ratio of the fluorescent particles to the organic chemicals (or glass) is about 0.6 to 8; that is, it can be expressed as "amount by weight of fluorescent particles: amount by weight of organic chemicals (or glass) ≈0.6:1 to 8:1". The wavelength-converting layer mixed with the glass as described above is applied at a temperature ranging between about 100° C. and about 500° C. The wavelength-converting layer includes, but not limited to, a convex, a concave, a flat, or a pyramid shape. FIG. 1 shows that the wavelength-converting layer 101 has a convex shape. The wavelength-converting layer 101 can have a thickness of about 1 μm to about 200 μm, preferably of about 10 μm to about 100 μm. The light emitting unit 100 can emit a light having a peak wavelength ranging between about 200 nm and about 500 nm. The frame 102 is made of a transparent material such as epoxy resin, silicone resin, polyimide resin, glass, quartz, acryl resin such as polymethylmethacrylate (PMMA) etc., polycarbonate (PC) resin, SU-8 resist, BCB resist, or parylene. Alternatively, the frame 102 can be a single metallic layer or multiple metallic layers. The frame 102 can be provided using at least one of spin coating, dip coating, chemical vapor deposition, thermal evaporation, and e-beam evaporation. The frame 102 can have a thickness of about 0.1 μm to about 200 μm, preferably of about 2 μm to about 100 μm. The substrate 106 can be an opaque substrate made of, for example, metal, ceramic, or semiconductor. FIG. 1 shows that the light emitting unit 100 is a vertical light emitting device. A light diffusion layer 107 can be provided on the wavelength-converting layer 101.

In various embodiments of the invention shown in the figures, while the frame can be provided over the light emitting semiconductor, it can further extend to cover a side portion of the light emitting semiconductor. In a case where the frame extends to cover a side portion of the light emitting semiconductor, the wavelength-converting layer may or may not encapsulate the side portion of the light emitting semiconductor. For example, the wavelength-converting layer in FIG. 1 does not encapsulate a side portion of the light emitting semiconductor, whereas the wavelength-converting layer in FIG. 2 encapsulates a side portion of the light emitting semiconductor.

Figure 2:
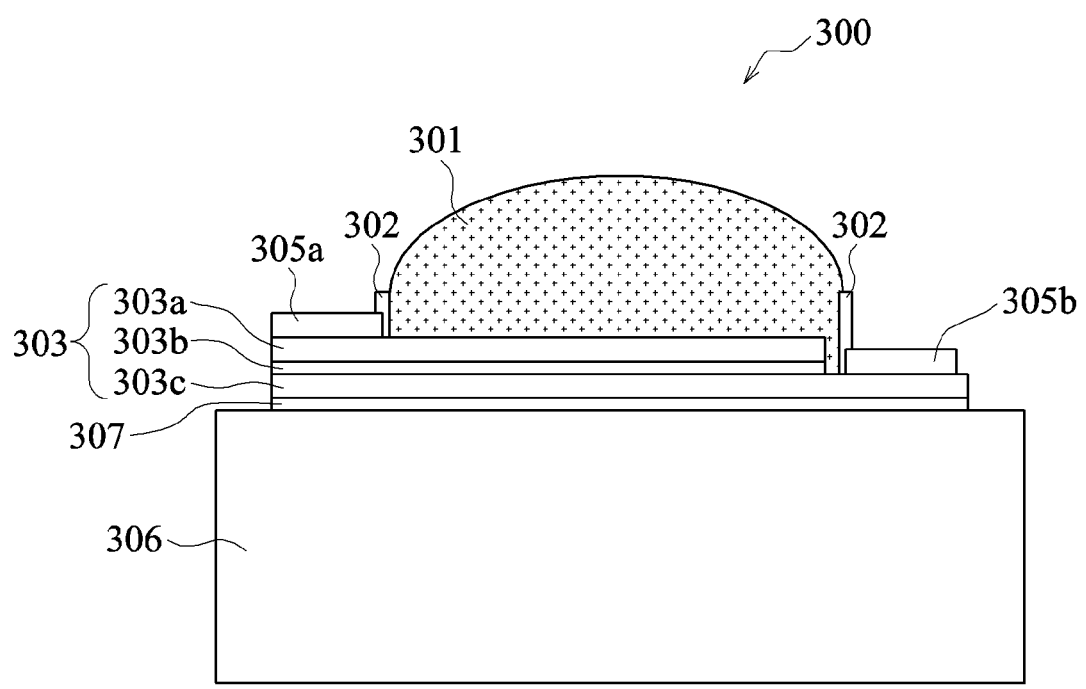
FIG. 2 shows a simplified cross-sectional view of a separate, individual light emitting unit diced from a wafer-type light emitting device according to an embodiment of the invention.

FIG. 2 shows a simplified cross-sectional view of a separate, individual light emitting unit 300 diced from a wafer-type light emitting device according to an embodiment of the invention. FIG. 2 shows that the light emitting unit 300 is a horizontal light emitting unit. As shown in FIG. 2, the light emitting unit 300 includes a substrate 306, a light emitting semiconductor 303 formed on the substrate 306, a frame 302 provided over the light emitting semiconductor 303, and a wavelength-converting layer 301 applied on the light emitting semiconductor 303 and confined by the frame 302. A first bonding pad 305a (which is provided on an n-type semiconductor layer 303a) and a second bonding pad 305b (which is provided on a p-type semiconductor layer 303c) are provided on the light emitting semiconductor 303 of the light emitting unit 300. The light emitting semiconductor 303 can include a p-type semiconductor layer 303c formed on the substrate 306, an activation layer 303b provided on the p-type semiconductor layer 303c, and an n-type semiconductor layer 303a provided on the activation layer 303b. The light emitting semi-conductors according to other embodiments of the invention can have the same or similar configuration as the light emitting semiconductor 303 shown in FIG. 2. Moreover, a reflection layer 307 can be provided between the substrate 306 and the light emitting semiconductor 303. Specifically, the reflection layer 307 is positioned between the substrate 306 and the p-type semiconductor layer 303c. The reflection layer 307 can also be adapted to other embodiments of the invention. A surface of the light emitting semiconductor 303 that is adjacent to the wavelength-converting layer 301 can also be roughened, though this is not shown in FIG. 2. Specifically, a surface of the n-type semiconductor layer 303a can be roughened. In addition, in the embodiments of the invention, a wavelength-converting layer can encapsulate a portion of a frame without overflowing from the confinement of the frame. For example, as shown in FIG. 2, the wavelength-converting layer 301 encapsulates a portion of the frame 302 that is shown on the right of the figure, but it does not overflow from the frame 302.

Figure 3:
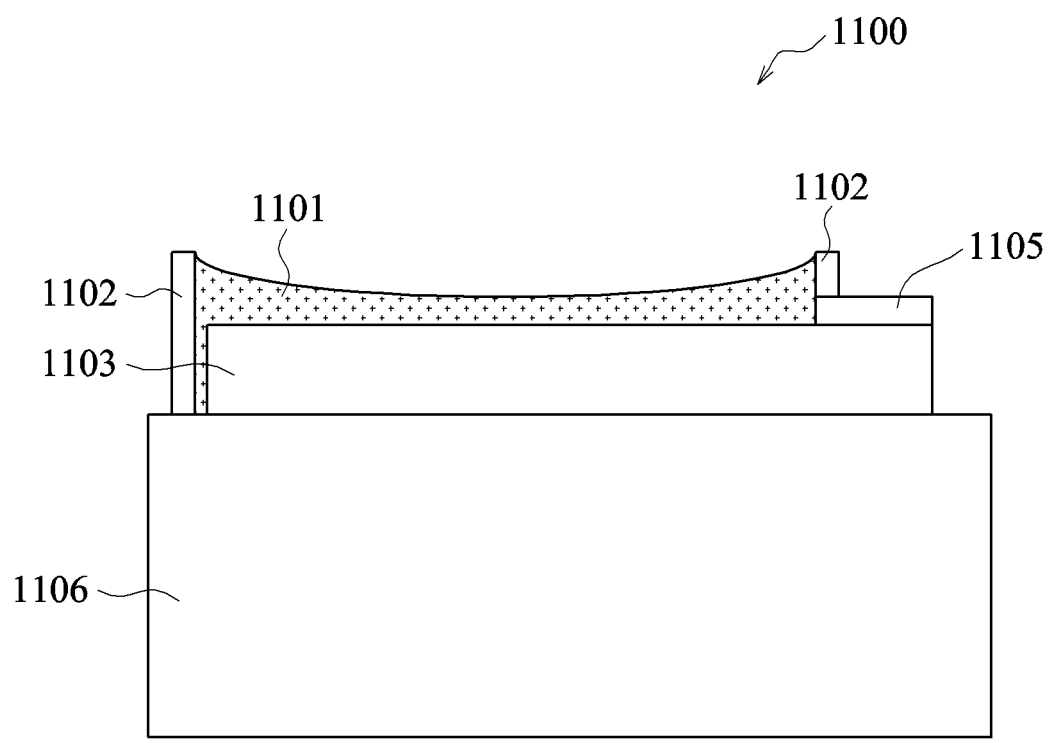
FIG. 3 shows a simplified cross-sectional view of a separate, individual light emitting unit diced from a wafer-type light emitting device according to an embodiment of the invention.

FIG. 3 shows a simplified cross-sectional view of a separate, individual light emitting unit 1100 diced from a wafer-type light emitting device according to an embodiment of the invention. As shown in FIG. 3, the light emitting unit 1100 includes a substrate 1106, a light emitting semiconductor 1103, a frame 1102, and a wavelength-converting layer 1101, wherein the wavelength-converting layer 1101 has a concave shape. A bonding pad 1105 is provided on the light emitting semiconductor 1103 of the light emitting unit 1100.

Figure 4:
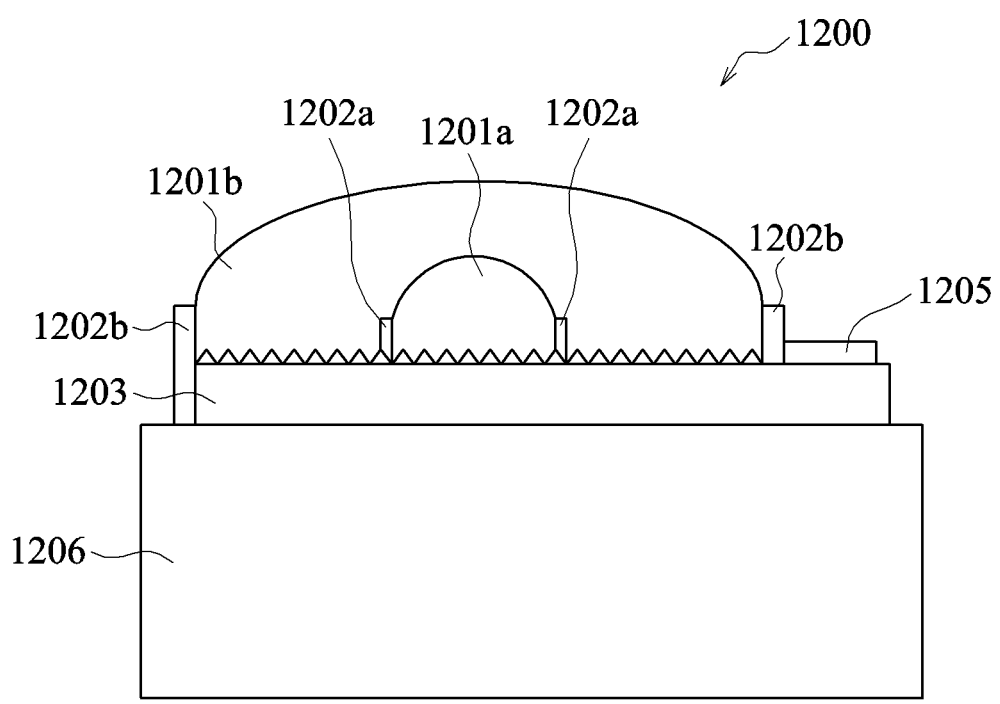
FIG. 4 shows a simplified cross-sectional view of a separate, individual light emitting unit diced from a wafer-type light emitting device according to an embodiment of the invention.

FIG. 4 shows a simplified cross-sectional view of a separate, individual light emitting unit 1200 diced from a wafer-type light emitting device according to an embodiment of the invention. As shown in FIG. 4, the light emitting unit 1200 includes a substrate 1206, a light emitting semiconductor 1203, a first frame 1202a, a second frame 1202b, a first wavelength-converting layer 1201a, and a second wavelength-converting layer 1201b. The first frame 1202a is surrounded by the second frame 1202b. The first wavelength-converting layer 1201a is applied to an area on the light emitting semiconductor 1203 that is confined by the first frame 1202a, and the second wavelength-converting layer 1201b is applied to an area on the light emitting semiconductor 1203 that is confined by the second frame 1202b. The second wavelength-converting layer 1201b provided within the second frame 1202b can encapsulate the first wavelength-converting layer 1201a provided within the first frame 1202a, thereby forming multiple (overlaid) wavelength-converting layers. A bonding pad 1205 can be provided on the light emitting semiconductor 1203 of the light emitting unit 1200.

Figure 5:
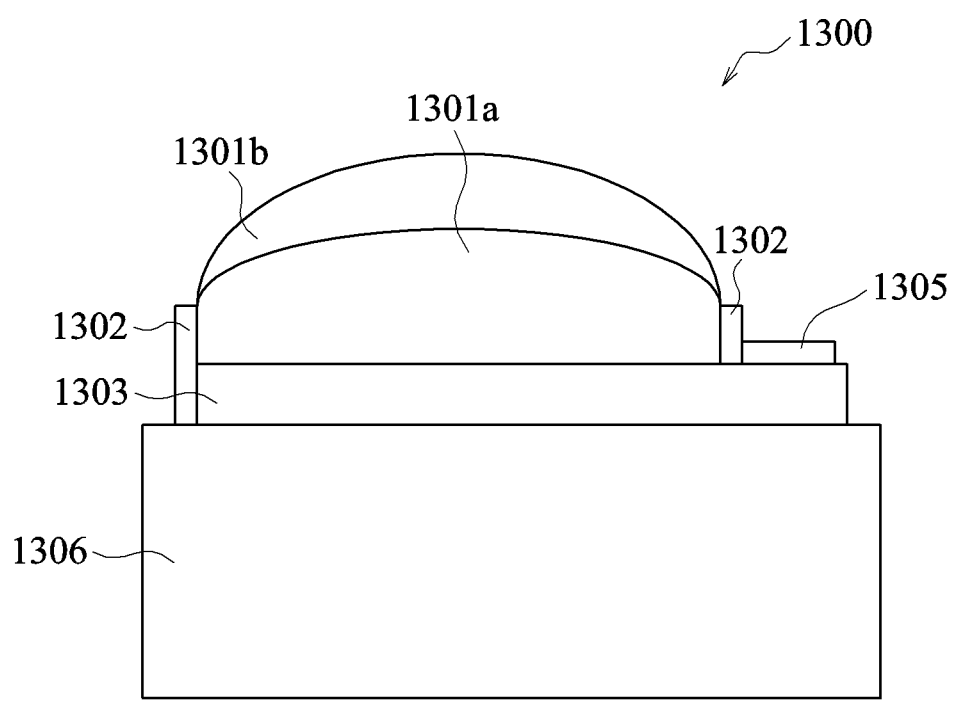
FIG. 5 shows a simplified cross-sectional view of a separate, individual light emitting unit diced from a wafer-type light emitting device according to an embodiment of the invention.

FIG. 5 shows a simplified cross-sectional view of a separate, individual light emitting unit 1300 diced from a wafer-type light emitting device according to an embodiment of the invention. As shown in FIG. 5, the light emitting unit 1300 includes a substrate 1306, a light emitting semiconductor 1303, a frame 1302, a first wavelength-converting layer 1301a, and a second wavelength-converting layer 1301b. The embodiment depicted in FIG. 5 is similar to that in FIG. 4, except that the first wavelength-converting layer 1301a and the second wavelength-converting layer 1301b are applied within the same frame (i.e. frame 1302) as shown in FIG. 5. The second wavelength-converting layer 1301b encapsulates the first wavelength-converting layer 1301a, thereby forming multiple (overlaid) wavelength-converting layers. A bonding pad 1305 can be provided on the light emitting semiconductor 1303 of the light emitting unit 1300.

Figure 6:
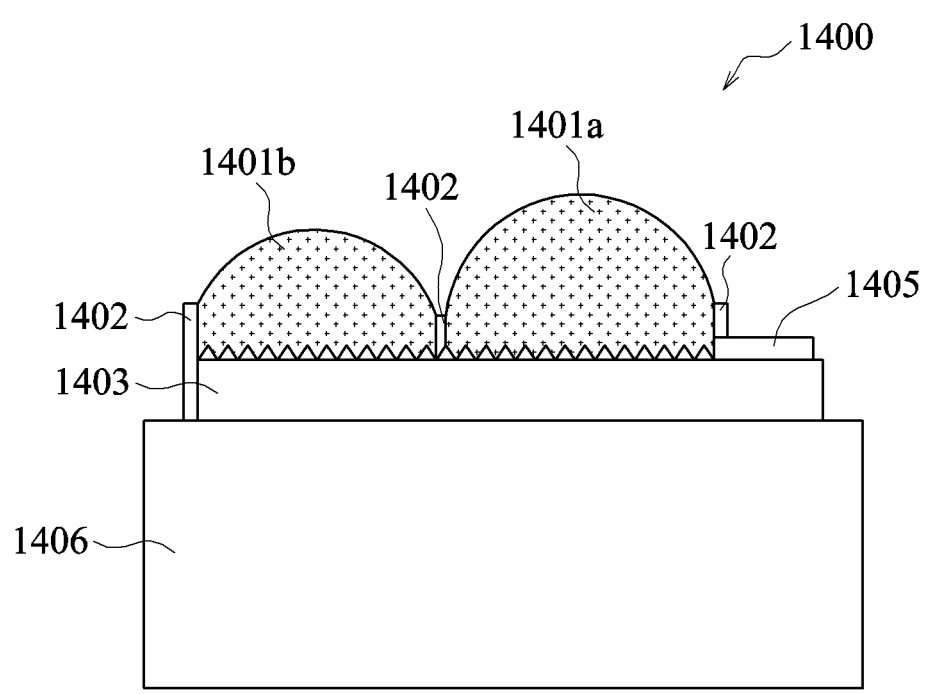
FIG. 6 shows a simplified cross-sectional view of a separate, individual light emitting unit diced from a wafer-type light emitting device according to an embodiment of the invention.

FIG. 6 shows a simplified cross-sectional view of a separate, individual light emitting unit 1400 diced from a wafer-type light emitting device according to an embodiment of the invention. As shown in FIG. 6, the light emitting unit 1400 includes a substrate 1406, a light emitting semiconductor 1403, a frame 1402, a first wavelength-converting layer 1401a, and a second wavelength-converting layer 1401b. The frame 1402 provided over the light emitting semiconductor 1403 divides the light emitting semiconductor 1403 into two regions, within which the first wavelength-converting layer 1401a and the second wavelength-converting layer 1401b are applied respectively, thereby forming multiple (side-by-side) wavelength-converting layers on the light emitting semiconductor 1403. A bonding pad 1405 can be provided on the light emitting semiconductor 1403 of the light emitting unit 1400.

Figure 7:
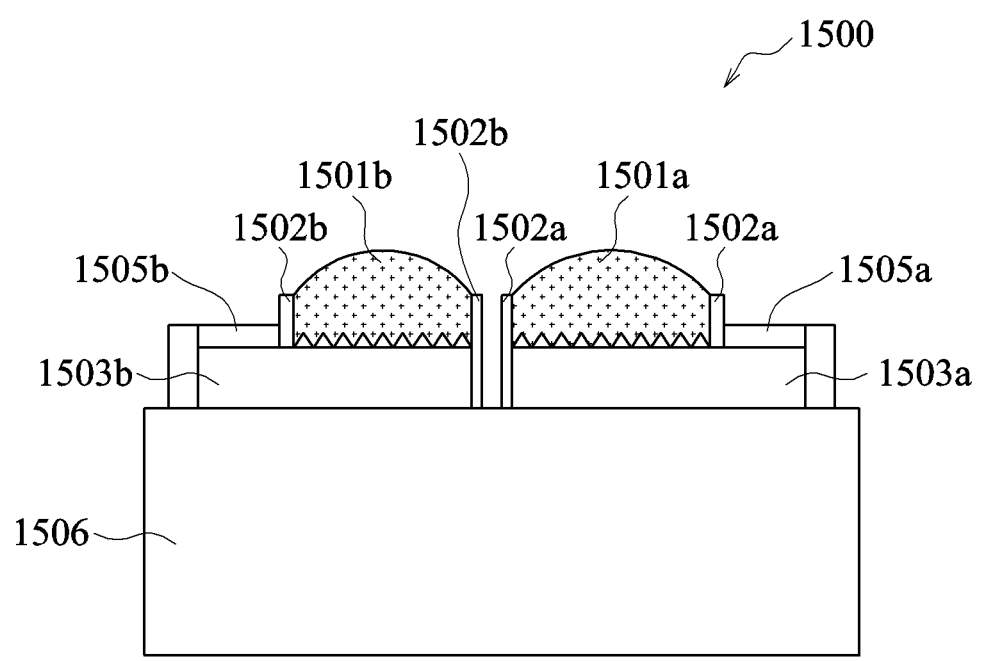
FIG. 7 shows a simplified cross-sectional view of a separate, individual light emitting unit diced from a wafer-type light emitting device according to an embodiment of the invention.

FIG. 7 shows a simplified cross-sectional view of a separate, individual light emitting unit 1500 diced from a wafer-type light emitting device according to an embodiment of the invention. As shown in FIG. 7, the light emitting unit 1500 includes a substrate 1506, a first light emitting semiconductor 1503a formed on the substrate 1506, a second light emitting semiconductor 1503b formed on the substrate 1506, a first frame 1502a provided over the first light emitting semiconductor 1503a, a second frame 1502b provided over the second emitting semiconductor 1503b, a first wavelength-converting layer 1501a applied on the first light emitting semiconductor 1503a and confined by the first frame 1502a, and a second wavelength-converting layer 1501b applied on the second light emitting semiconductor 1503b and confined by the second frame 1502b. A first bonding pad 1505a is provided on the first light emitting semiconductor 1503a of the light emitting unit 1500, and a second bonding pad 1505b is provide on the second light emitting semiconductor 1503b of the light emitting unit 1500. In the embodiment shown in FIG. 7, the first wavelength-converting layer 1501a and the second wavelength-converting layer 1501b are applied within the first frame 1502a and the second frame 1502b, respectively. Alternatively, features of the embodiment depicted in FIG. 6 can be adapted to the embodiment depicted in FIG. 7. Specifically, the frame shown in FIG. 6 can be provided over each of the first light emitting semiconductor 1503a and the second light emitting semiconductor 1503b shown in FIG. 7, and multiple (side-by-side) wavelength-converting layers can be formed on each of the first light emitting semiconductor 1503a and the second light emitting semiconductor 1503b. Still alternatively, features of the embodiment depicted in FIG. 4 or 5 can be adapted to the embodiment depicted in FIG. 7 to form multiple (overlaid) wavelength-converting layers on each of the first light emitting semiconductor 1503a and the second light emitting semiconductor 1503b. Moreover, the embodiment depicted in FIG. 7 can also include the concave wavelength-converting layer shown in FIG. 3.

In the embodiments of the invention, the first wavelength-converting layer and the second wavelength-converting layer may be the same or different wavelength-converting layers.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A wafer-type light emitting device comprising:
a plurality of light emitting units, wherein the plurality of light emitting units are diced into a plurality of separate and individual light emitting units and each light emitting unit comprises:
  a substrate;
  a light emitting semiconductor formed adjacent and above said substrate;
  a main frame, deposited on said light emitting semiconductor and extending to a side portion of said light emitting semiconductor, for forming a main deposition area;
  an inner frame, deposited on said light emitting semiconductor, for forming an inner deposition area, wherein said inner deposition area is within said main deposition area;
  a first wavelength-converting layer, deposited within said inner deposition area, and adjacent and above said light emitting semiconductor; and
  a second wavelength-converting layer, deposited within said main deposition area, and adjacent and above said first wavelength-converting layer.

2. The wafer-type light emitting device of claim 1, wherein the light emitting units emit a light having a peak wavelength ranging between about 200 nm and about 500 nm.

3. The wafer-type light emitting device of claim 1, wherein said first and second wavelength-converting layers are applied using at least one of precise dispensing, precise stamping, precise jetting, and screen printing.

4. The wafer-type light emitting device of claim 1, wherein said first and second wavelength-converting layers include fluorescent particles mixed with an organic chemical.

5. The wafer-type light emitting device of claim 4, wherein a weight ratio of the fluorescent particles to said organic chemical is about 0.6 to 8.

6. The wafer-type light emitting device of claim 4, wherein said organic chemical is selected from the group consisting of silicone resin, epoxy resin and the combination of silicone resin and epoxy resin.

7. The wafer-type light emitting device of claim 1, wherein said first and second wavelength-converting layers include fluorescent particles mixed with a glass.

8. The wafer-type light emitting device of claim 7, wherein a weight ratio of the fluorescent particles to the glass is about 0.6 to 8.

9. The wafer-type light emitting device of claim 7, wherein said first and second wavelength-converting layers mixed with the glass are applied using at least one of precise dispensing, precise stamping, precise jetting, and screen printing.

10. The wafer-type light emitting device of claim 9, wherein said first and second wavelength-converting layers mixed with the glass are applied at a temperature ranging between about 100° C. and about 500° C.

11. The wafer-type light emitting device of claim 1, wherein said first and second wavelength-converting layers have a convex, a concave, a flat, or a pyramid shape.

12. The wafer-type light emitting device of claim 1, wherein said main frame and said inner frame are made of a transparent material.

13. The wafer-type light emitting device of claim 12, wherein the transparent material is epoxy resin, silicone resin, polyimide resin, glass, quartz, acryl resin, polycarbonate resin, SU-8 resist, BCB resist, or parylene resin.

14. The wafer-type light emitting device of claim 1, wherein said main frame and said inner frame are provided using at least one of spin coating, dip coating, chemical vapor deposition, thermal evaporation, and e-beam evaporation.

15. The wafer-type light emitting device of claim 1, wherein said main frame and said inner frame are composed of a single metallic layer or multiple metallic layers.

16. The wafer-type light emitting device of claim 1, wherein said main frame and said inner frame each has a thickness of about 0.1 µm to about 200 µm.

17. The wafer-type light emitting device of claim 1, wherein said first and second wavelength-converting layers each has a thickness of about 1 µm to about 200 µm.

18. The wafer-type light emitting device of claim 1, further comprising:
a light diffusion layer provided on said first and second wavelength-converting layers.

19. The wafer-type light emitting device of claim 1, wherein the substrate is opaque.

20. The wafer-type light emitting device of claim 19, wherein the substrate is metal, ceramic, or semiconductor.

21. The wafer-type light emitting device of claim 20, further comprising:
a reflection layer provided between the substrate and said light emitting semiconductor.

22. The wafer-type light emitting device of claim 1, wherein a surface of said light emitting semiconductor that is adjacent to said first and second wavelength-converting layers is roughened.

23. The wafer-type light emitting device of claim 1, wherein said first and second wavelength-converting layers undergo a heat treatment.

24. The wafer-type light emitting device of claim 23, wherein a temperature of said heat treatment is between about 60° C. and about 300° C.

25. The wafer-type light emitting device of claim 1, wherein said light emitting semiconductor includes:
a p-type semiconductor layer formed on the substrate;
an activation layer provided on the p-type semiconductor layer; and
an n-type semiconductor layer provided on the activation layer.

26. The wafer-type light emitting device of claim 1, wherein said first and second wavelength-converting layers encapsulate a portion of said main and inner frames.

* * * * *